US005521947A

United States Patent [19]
Madsen

[11] Patent Number: 5,521,947
[45] Date of Patent: May 28, 1996

[54] PHASE DETECTION RESET IN PHASE LOCKED LOOPS USED FOR DIRECT VCO MODULATION

[75] Inventor: Benny Madsen, Santa Clara, Calif.

[73] Assignee: National Semiconductor Corporation, Santa Clara, Calif.

[21] Appl. No.: 239,451

[22] Filed: May 9, 1994

Related U.S. Application Data

[63] Continuation-in-part of Ser. No. 29,134, Mar. 10, 1993.

[51] Int. Cl.$^6$ .................................................. H03D 3/24
[52] U.S. Cl. ........................ 375/375; 375/376; 327/156
[58] Field of Search .................................. 375/375, 376; 327/143, 155, 156, 144, 146, 147

[56] References Cited

U.S. PATENT DOCUMENTS

| | | | |
|---|---|---|---|
| 4,449,102 | 5/1984 | Frazer et al. | 328/162 |
| 4,516,083 | 5/1985 | Turney | 331/1 A |
| 4,542,531 | 9/1985 | Fukumura | 455/76 |
| 4,703,520 | 10/1987 | Rozanski et al. | 455/75 |
| 4,761,821 | 8/1988 | Mawhinney et al. | 455/73 |
| 4,873,702 | 10/1989 | Chiu | 375/76 |
| 4,903,257 | 2/1990 | Takeda et al. | 370/29 |
| 5,175,729 | 12/1992 | Borras et al. | 370/79 |
| 5,230,088 | 7/1993 | Kramer, Jr. et al. | 455/76 |
| 5,276,913 | 1/1994 | Lee et al. | 455/76 |
| 5,319,799 | 6/1994 | Morita | 455/78 |
| 5,327,582 | 7/1994 | Wong | 455/76 |
| 5,351,015 | 9/1994 | Masumoto et al. | 331/1 R |
| 5,363,402 | 11/1994 | Harmon | 375/1 |

FOREIGN PATENT DOCUMENTS

| | | | |
|---|---|---|---|
| 0333419 | 3/1989 | European Pat. Off. | H04B 1/56 |
| 2523388 | 9/1983 | France . | |
| 2535545 | 5/1984 | France . | |
| 2188212 | 9/1987 | United Kingdom | H04B 1/56 |
| WO81/02653 | 9/1981 | WIPO . | |
| WO92/22147 | 12/1992 | WIPO | H04B 1/40 |

OTHER PUBLICATIONS

Shigeki Saito et al., "State–Preserving Intermittently Locked Loop (Spill) Frequency Synthesiser for Portable Radio," *IEEE Transactions on Microwave Theory and Techinques*, vol. 37, No. 12 (Dec. 1989), pp. 1898–1903.
Supplemental Information Disclosure Statement including four declarations and exhibits A–D which were previously filed on Sep. 19, 1994, in U.S. patent application Ser. No. 08/029,134.

*Primary Examiner*—Stephen Chin
*Assistant Examiner*—Tesfaldet Bocure
*Attorney, Agent, or Firm*—Limbach & Limbach

[57] ABSTRACT

A phase-lock loop (PLL) includes a switch for opening the loop (e.g. for direct modulation of its voltage-controlled oscillator (VCO) during transmission of an intermittent signal such as data bursts) and has a phase comparator which can be selectively initialized (e.g. by setting to a programmed value or resetting to zero or terminal count value the reference and/or feedback signal frequency dividers) so that upon "re-closing" of the loop the PLL will achieve phase-lock within a predetermined amount of time. When the loop is opened, the VCO's dc ("phase-lock") control voltage can be maintained so as to help ensure that phase-lock will be achieved within the desired amount of time.

24 Claims, 8 Drawing Sheets

1

PHASE DETECTION RESET IN PHASE LOCKED LOOPS USED FOR DIRECT VCO MODULATION

RELATED APPLICATIONS

This is a Continuation-In-Part of Application Ser. No. 08/029,134, filed Mar. 10, 1993, and entitled "Radio Frequency Telecommunications Transceiver".

BACKGROUND OF THE INVENTION

1. Field of the Invention

The present invention relates to phase-lock loops, and in particular, to phase-lock loops with presettable phase detectors.

2. Description of the Related Art

In communication systems, such as those operating in a time division duplex (TDD) or time division multiple access (TDMA) mode, a phase-lock loop (PLL) is often used to provide the modulated radio frequency (RF) signal. In such systems, the PLL may be modulated directly, i.e. where the loop is closed to acquire phase and/or frequency locking and the loop is opened during modulation. Benefits of such a modulation technique include fast acquisition and low spurious signals by the PLL.

However, a problem encountered when re-closing the loop involves the phase, or frequency, settling time needed to re-acquire phase-lock. In direct, or open-loop, modulation of a PLL the loop is opened while the modulation signal is applied directly to the PLL's voltage-controlled oscillator (VCO). While the loop is opened, the phase detector, i.e. the dividers (e.g. counters) and phase comparator, loses all information about any phase difference(s) between the reference signal and the feedback signal from the VCO. Upon re-closing the loop after modulation, the feedback-reference phase difference is unknown. Accordingly, the PLL will try to lock initially to a random phase, which can cause a big jump in frequency. This in turn translates to a large phase-settling time interval which is often longer than the settling time following a frequency step made while the loop remains locked, and which can be problematic in systems such as wireless local area network (LAN) systems where the transceiver needs to be able to receive immediately after transmitting a packet of data.

Hence, it would be desireable to have a PLL for which the phase-settling time after the loop is re-closed following direct modulation thereof can be preselected or minimized.

SUMMARY OF THE INVENTION

In accordance with the present invention, a phase-lock loop (PLL) is selectively opened and then re-closed to re-achieve phase-lock with a reference signal within a selectively predetermined phase-settling time interval. A PLL in accordance with a preferred embodiment of the present invention includes a frequency-tunable oscillator, signal disabler and signal comparator.

The frequency-tunable oscillator selectively receives a PLL tuning signal and in accordance therewith provides a closed-loop oscillator signal, and which provides an open-loop oscillator signal including a plurality of open-loop carrier frequencies when the PLL tuning signal is not being received. Initially upon receiving the PLL tuning signal, the closed-loop oscillator signal includes a plurality of phase-unlocked closed-loop carrier frequencies and phases, and after a phase-settling time interval includes a phase-locked closed-loop carrier frequency and phase.

The signal disabler is coupled to the frequency-tunable oscillator and receives a loop command signal in accordance with which it enables and disables the reception of the PLL tuning signal by the frequency-tunable oscillator.

The signal comparator is coupled to the frequency-tunable oscillator and the signal disabler, and receives the closed-loop oscillator signal and a reference oscillator signal which includes a reference carrier frequency and phase. The signal comparator compares the closed-loop oscillator signal with the reference oscillator signal and in accordance therewith provides a closed-loop tuning signal as the PLL tuning signal, and further receives a comparator initialization signal in accordance with which the phase-settling time interval can be selectively predetermined.

Further in accordance with the present invention, the PLL can be used in an RF transceiver wherein the frequency-tunable oscillator of the PLL provides a transmit carrier signal which is directly modulated by a transmit data signal while the carrier frequency remains approximately equal to a multiple of the reference signal frequency.

These and other features and advantages of the present invention will be understood upon consideration of the following detailed description of the invention and the accompanying drawings.

DETAILED DESCRIPTION OF THE INVENTION

Figure 1:
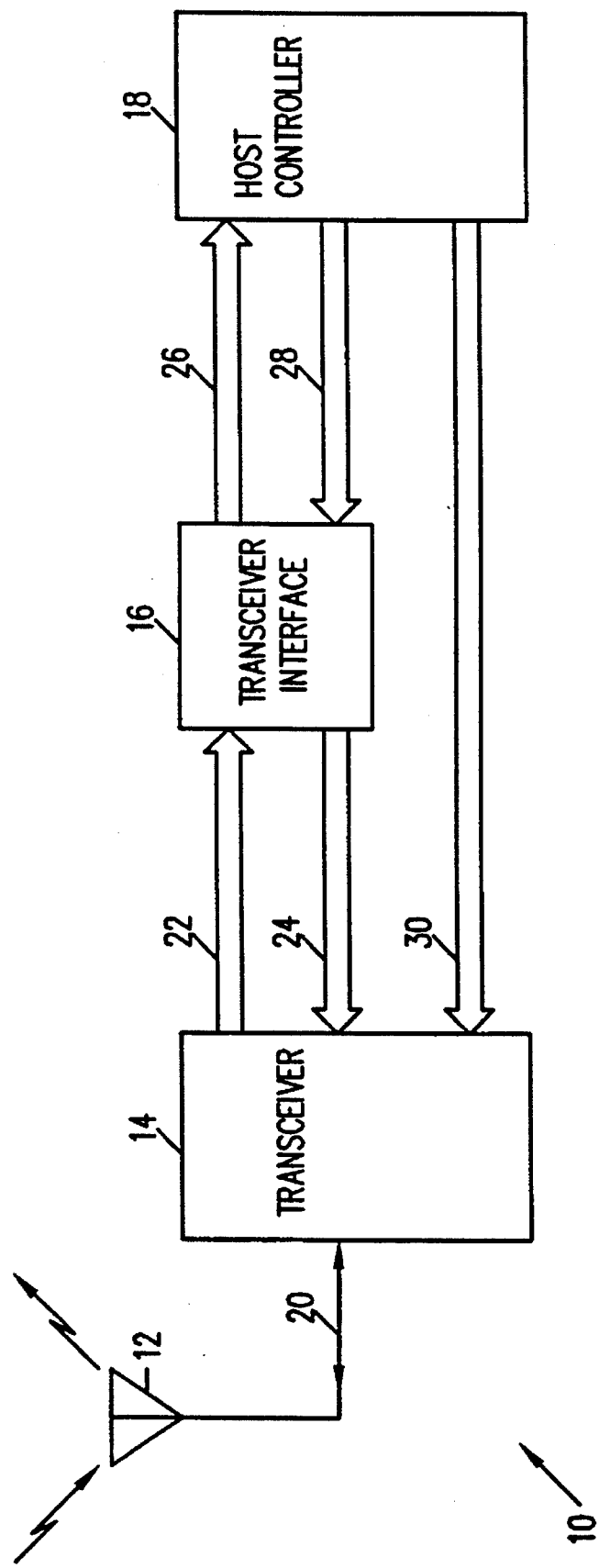
FIG. 1 is a functional block diagram of an RF transceiver system using a PLL in accordance with the present invention.

Referring to FIG. 1, an RF transceiver system 10 using a PLL in accordance with the present invention includes an antenna 12, transceiver 14, transceiver interface 16 and host controller 18, as shown. Between the antenna 12 and transceiver 14 is an RF signal path 20 which carries, according to a TDD format, the modulated transmit signal from the transceiver 14 to the antenna 12 and the modulated receive signal from the antenna 12 to the transceiver 14. As discussed further below, a number of signals 22, 24 pass between the transceiver 14 and transceiver interface 16 as do a number of signals 26, 28 between the transceiver 16 and host controller 18. Additional signals 30 pass from the host controller 18 to the transceiver 14.

Figure 2:
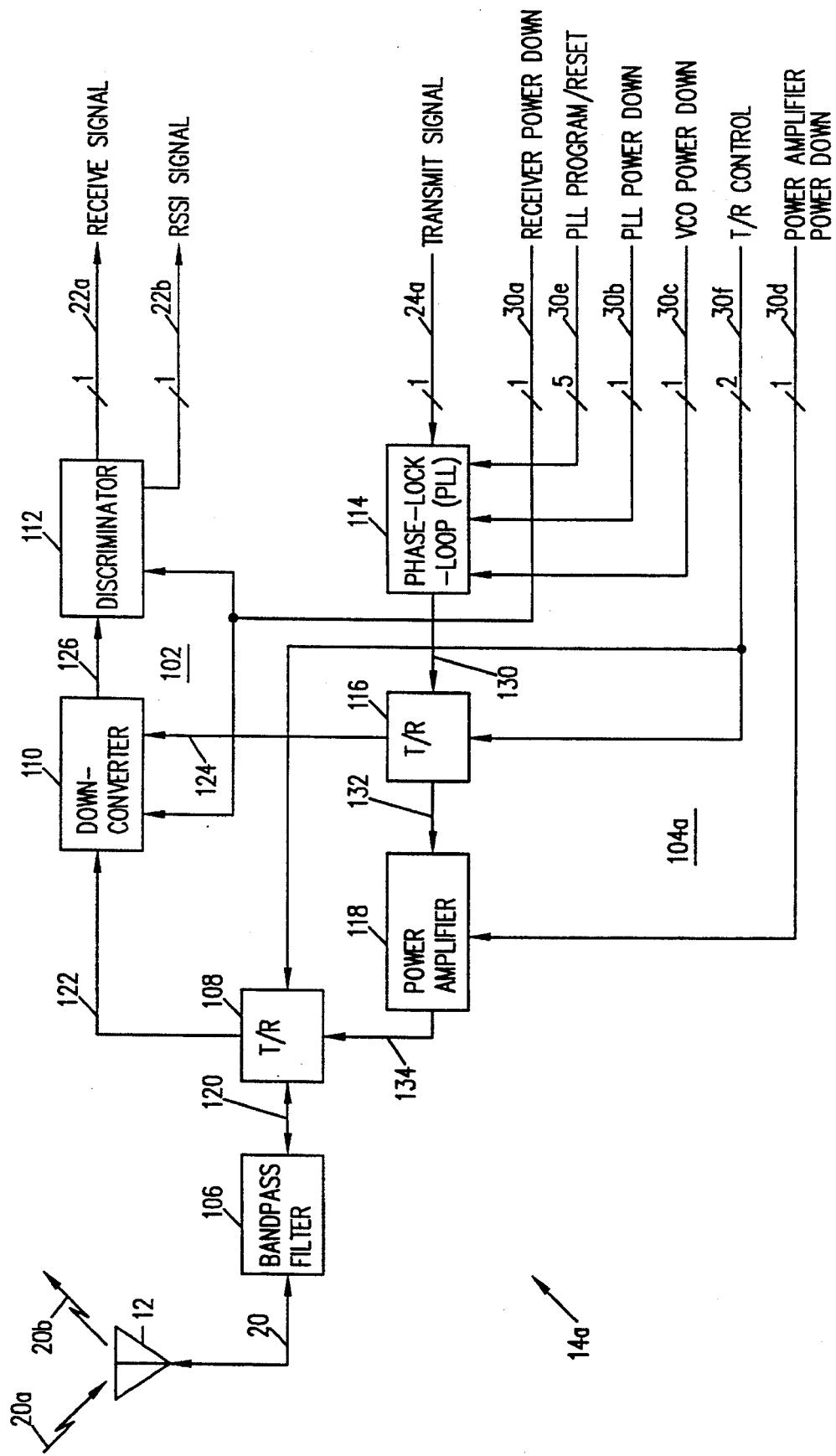
FIG. 2 is a block diagram of an RF transceiver using a PLL in accordance with the present invention.

Referring to FIG. 2, a preferred embodiment of a transceiver 14a using a PLL in accordance with the present invention includes a receiver 102, transmitter 104a, a bandpass filter 106 and antenna signal switch 108, as shown. The receiver 102 includes a down-converter 110 and discriminator 112. The transmitter 104a includes a phase-lock loop (PLL) 114, transmit signal switch 116 and power amplifier 118.

During signal reception, a modulated receive signal 20a is received via the antenna 12, filtered by the bandpass filter 106 and conveyed to the antenna signal switch 108 (e.g. a PIN diode switch). In accordance with a T/P, or switch, control signal 30f, the antenna signal switch 108 passes the filtered, modulated receive signal 122 to the down-converter 110. The down-converter 110, in accordance with an enablement signal 30a, uses a local oscillator (LO) signal 124 to perform a single down-conversion. The down-converted signal 126 is passed to the discriminator 112, where it is discriminated, or frequency-demodulated, to produce a demodulated receive signal 22a representing the original serial data. Also produced is a DC receive signal strength indicator ("RSSI") signal 22b, which indicates the signal strength of the received signal. (Further discussion of the receiver 102 can be found in the above-cited parent application having Ser. No. 08/029,134, the disclosure of which is incorporated herein by reference.)

The receiver 102, i.e. the down-converter 110 and discriminator 112, receives a receiver power down signal 30a which acts as a form of an enablement signal. When this signal 30a is "false," the receiver 102 is enabled, i.e. powered up, and when this signal 30a is "true," the receiver 102 is disabled, i.e. powered down, to minimize DC power consumption.

Similarly, the transmitter 104a receives similar power down, or enablement, signals 30b, 30c, 30d. The PLL 114 receives a PLL power down signal 30b for powering down the active PLL components other than the oscillator. The PLL 114 also receives a VCO power down signal 30c for disabling and enabling the voltage-controlled oscillator. The power amplifier 118 receives a power amplifier power down signal 30d for selectively enabling and disabling the power amplifier 118. This last signal 30d is preferably shaped in such a manner to be other than a square wave, e.g. as a trapezoidally-shaped signal to reduce spurious output signals from the power amplifier 118.

The transmitter 104a has a PLL 114 which produces an RF transmit signal 130 which is selectively routed by the transmit signal switch 116 in accordance with its T/R control signal 30f. When the transceiver 14a is operating in the transmit mode, the transmit signal switch 116 sends the RF signal 132 to the power amplifier 118. The amplified transmit signal 134 is sent to the antenna signal switch 108 which, in accordance with its T/R control signal 30f, sends it on to be filtered by the filter 106 and transmitted via the antenna 12. When the transceiver 14a is operating in the receive mode, the RF signal 130 from the PLL 114 is routed by the transmit signal switch 116 to the down-converter 110 in the receiver 102 as the receiver LO signal 124. During signal transmission, the PLL 114 receives a transmit signal 24a from the transceiver interface 16 (discussed further below). This transmit signal 24a is used to directly modulate the RF transmit carrier produced by a VCO within the PLL 114 (discussed further below). The modulated signal 130 is then initially routed (by the transmit signal switch 116), amplified (by the power amplifier 118), routed again (by the antenna signal switch 108), filtered (by the filter 106) and transmitted (via the antenna 12).

The PLL 114 also receives a set 30e of PLL program/reset signals used to selectively preset (e.g. program or reset) two frequency dividers within the PLL 114 (discussed further below). This causes its output signal 130 to selectively vary in frequency, depending upon whether it is to be used as the transmit carrier signal 132 or as the receiver LO signal 124.

Figure 3:
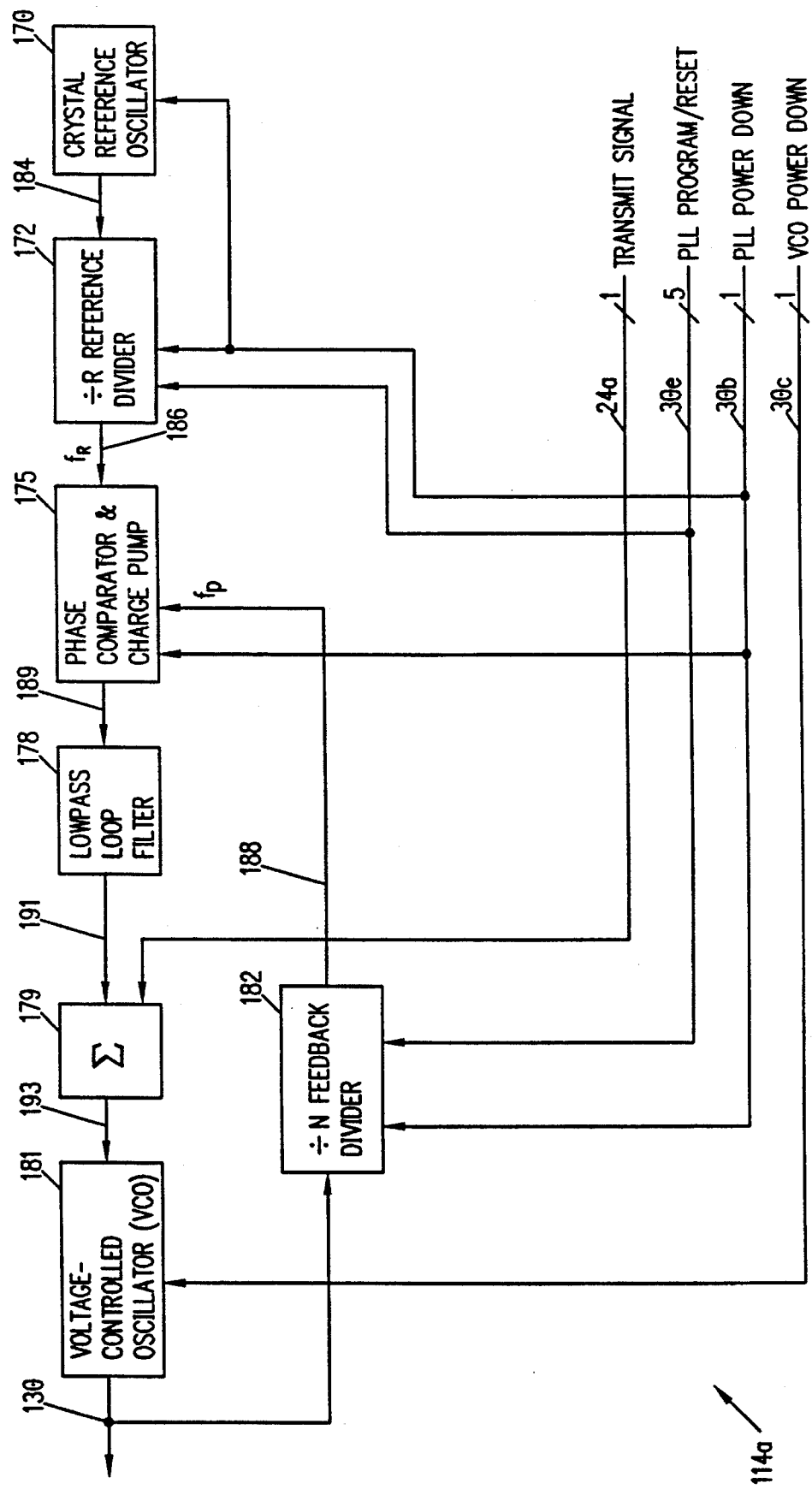
FIG. 3 is a block diagram of a PLL in accordance with a preferred embodiment of the present invention for the transceiver of FIG. 2.

Referring to FIG. 3, a preferred embodiment of a PLL 114a in accordance with the present invention includes the following elements, as shown: crystal reference oscillator 170; ÷R reference divider 172; phase comparator and charge pump 175; lowpass loop filter 178; summer 179; voltage-controlled oscillator (VCO) 181; and ÷N feedback divider 182. The crystal reference oscillator 170 provides a reference signal 184 which is divided by the reference divider 172. The frequency-divided reference signal 186 (at frequency $f_R$) is compared with the frequency-divided output signal 188 (at frequency $f_P$) in the phase comparator and charge pump 175. The resulting output signal 189 (AC when the inputs 186, 188 differ in frequency, DC when inputs 186, 188 are equal in frequency, and approximately zero volts when the inputs 186, 188 are equal in both frequency and phase) is inputted to the loop filter 178. The filtered output signal 191 is summed with the transmit signal 24a. The sum signal 193 is used as the control signal (phase-lock and modulation) for the VCO 181. The RF output signal 130 of the VCO 181 is fed back to the feedback divider 182 to produce the frequency-divided output signal 188 for the phase comparator and charge pump 175.

During modulation of the PLL 114a, the PLL power down signal 30b turns off the phase comparator and charge pump 175 (as well as the other active elements 170, 172, 182 within the PLL 114a). This causes the phase comparator and charge pump output 189 to remain constant since during this "turned-off" period the output impedance of the phase comparator and charge pump 175 is high (as is the input impedance of the input to the summer 179). This results in virtually no discharging of the shunt capacitance elements within the lowpass loop filter 178, thereby causing the DC carrier tuning voltage at the output 191 of the loop filter 178 to stay virtually constant (e.g. as a "tuning hold" signal) during the period of direct modulation of the VCO 181 (via the summer 179). Thus, the carrier frequency of the VCO output signal 130 varies little, i.e. it stays substantially frequency-locked to the frequency-divided reference signal 186 (although its phase will tend to drift away from its phase-locked condition with respect to the frequency-divided reference signal 186).

A more detailed description of the structure and operation of the phase comparator and charge pump 175 can be found in commonly assigned U.S. patent application Ser. No. 08/003,928, entitled "Charge Pump Circuit" and filed on Jan. 13, 1993, the disclosure of which is incorporated herein by reference.

Figure 4:
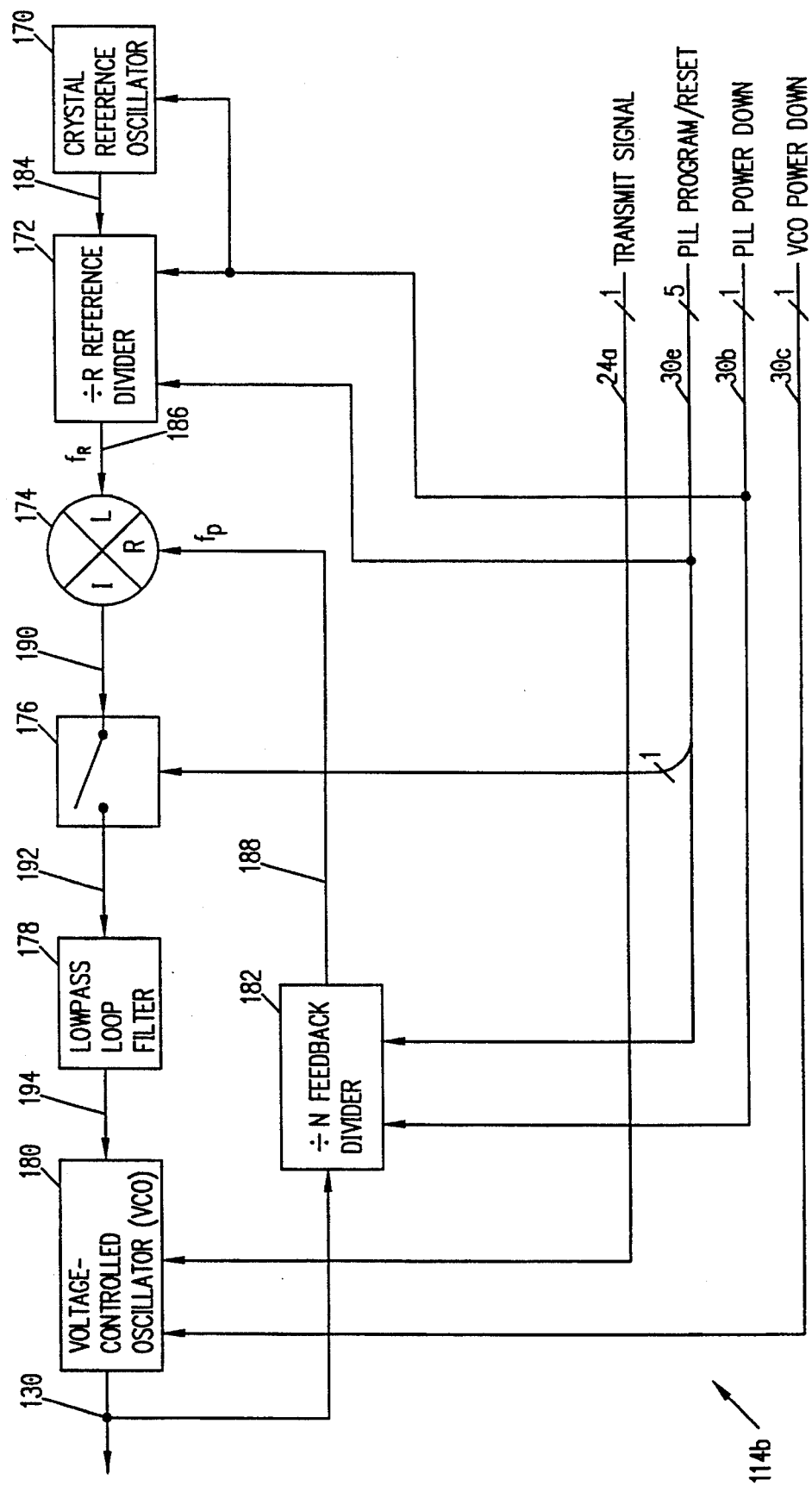
FIG. 4 is a block diagram of a PLL in accordance with an alternative preferred embodiment of the present invention for the transceiver of FIG. 2.

Referring to FIG. 4, an alternative embodiment of a PLL 114b in accordance with the present invention includes many of the same elements as the embodiment 114a of FIG. 3, with the following exceptions, as shown: mixer 174; loop switch 176; and dual-tuning input VCO 180 (discussed in more detail in the above-cited parent application Ser. No. 08/029,134). The frequency-divided reference signal 186 is mixed with the frequency-divided output signal 188 in the mixer 174 (which is used here as a phase detector rather than as a mixer per se). The resulting output signal 190 (AC when the inputs 186, 188 differ in frequency, DC when inputs 186, 188 are equal in frequency, and approximately zero volts when the inputs 186, 188 are equal in both frequency and phase) is inputted to the loop switch 176. During a period when the PLL 114b is not being modulated, the switch 176 is closed and passes this signal 190 directly to the loop filter 178. The filtered output signal 194 is used as the control, or carrier tuning, signal for the VCO 180. The RF output signal 130 of the VCO 180 is fed back to the feedback divider 182 to produce the frequency-divided output signal 188 for the mixer 174.

During modulation of the PLL 114b, one signal from the PLL program/reset signal set 30e is used to open the loop switch 176, thereby opening the carrier tuning loop. During this time, the output impedance of the loop switch 176 is high (as is the tuning input impedance of the VCO 180). This results in virtually no discharging of the shunt capacitance elements within the lowpass loop filter 178, thereby causing the DC voltage present at the input 192 to the loop filter 178, and therefore the DC carrier tuning voltage at the output 194 of the loop filter 178, to stay virtually constant (e.g. as a "tuning hold" signal) during the period of direct modulation of the VCO 180. Accordingly, the carrier frequency of the VCO output signal 130 varies little, i.e. it stays substantially frequency-locked to the frequency-divided reference signal 186 (although its phase will tend to drift away from its phase-locked condition with respect to the frequency-divided reference signal 186). The transmit signal 24a is fed to a second tuning input of the VCO 180 to directly modulate the oscillator.

As discussed above, the transmit signal 24a consists of short bursts of data. Accordingly, the loop switch 176 needs to be open only for brief periods of time. However, the loop only needs to be "closed" as of a point in time which is sufficiently prior to the time when a frequency-/phase-locked carrier signal is needed. Thus, in accordance with the present invention, the loop is normally kept "open" most of the time, either by turning off the PLL (FIG. 3) or opening the loop switch 176 (FIG. 4).

Figure 5:
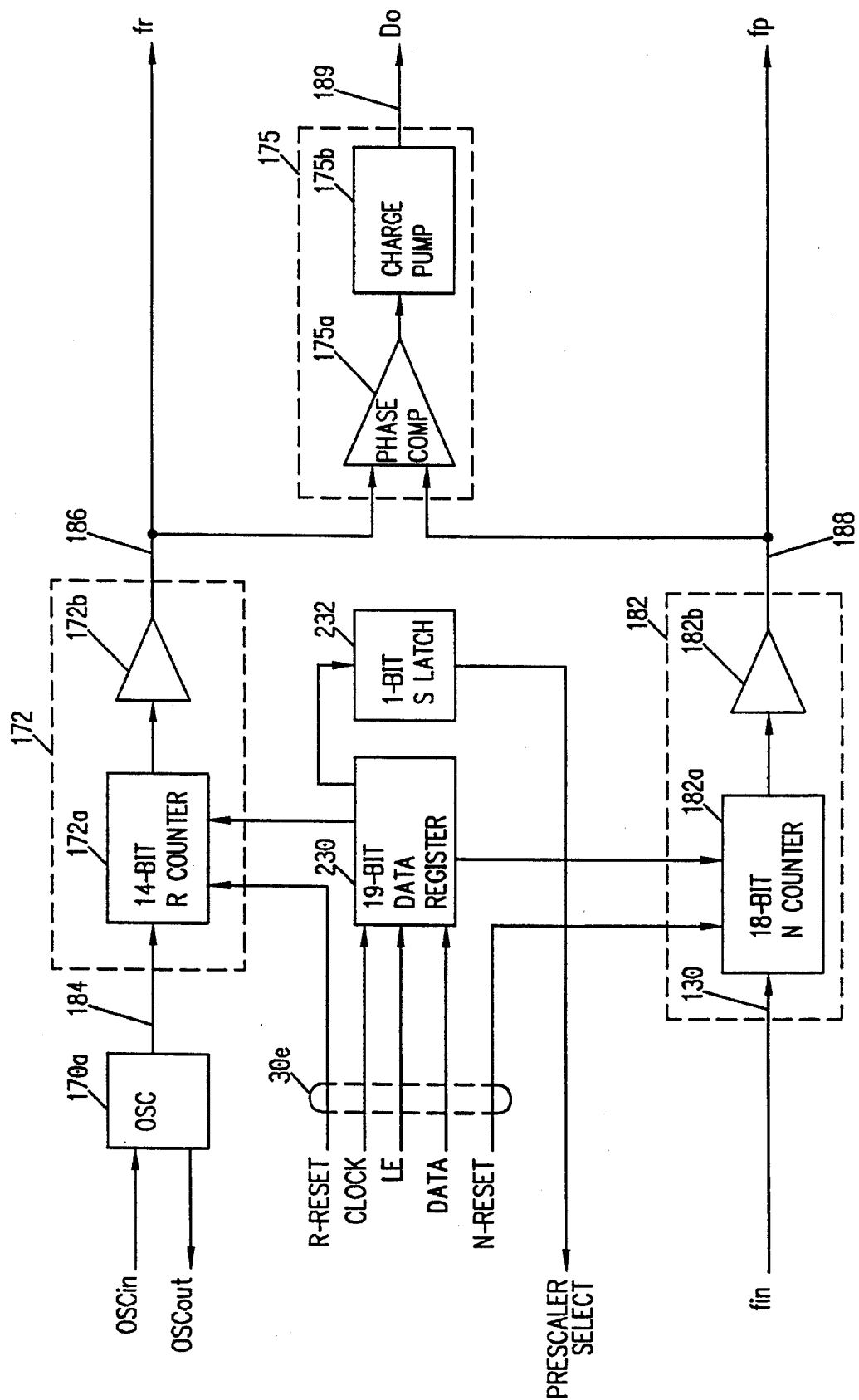
FIG. 5 is a simplified functional block diagram of the frequency dividers and phase detector for a PLL in accordance with a preferred embodiment of the present invention.

Referring to FIG. 5, the presetting of the reference 172 and feedback 182 dividers in the PLL 114 (114a in FIG. 3; 114b in FIG. 4) can be better understood. As discussed above, the PLL program/reset signal set 30e includes five signals: data; clock; load enable (LE); R-reset; and N-reset. The PLL preset data is clocked into a data register 230, and, upon assertion of the load enable signal, is loaded into the reference counter 172a of the reference divider 172 or feedback counter 182a of the feedback divider 182. Additionally, one bit is transferred to a latch 232 for use in selecting a prescaler divide ratio, or divisor (discussed further below). Thus, either the reference divider 172 or the feedback divider 182, or both, can be programmed, or preset, to correspond to preselected reference and feedback divisors, respectively.

Alternatively, the reference counter 172a of the reference divider 172 or the feedback counter 182a of the feedback divider 182, or both, can be reset to zero by the R-reset or N-reset signals, respectively. Therefore, either the reference 172 or feedback 182 divider, or both, can be preset to any desired value, i.e. by programming either or both counters 172a, 182a to preset the initial divisors, or resetting either or both counters to zero.

Figure 6A:
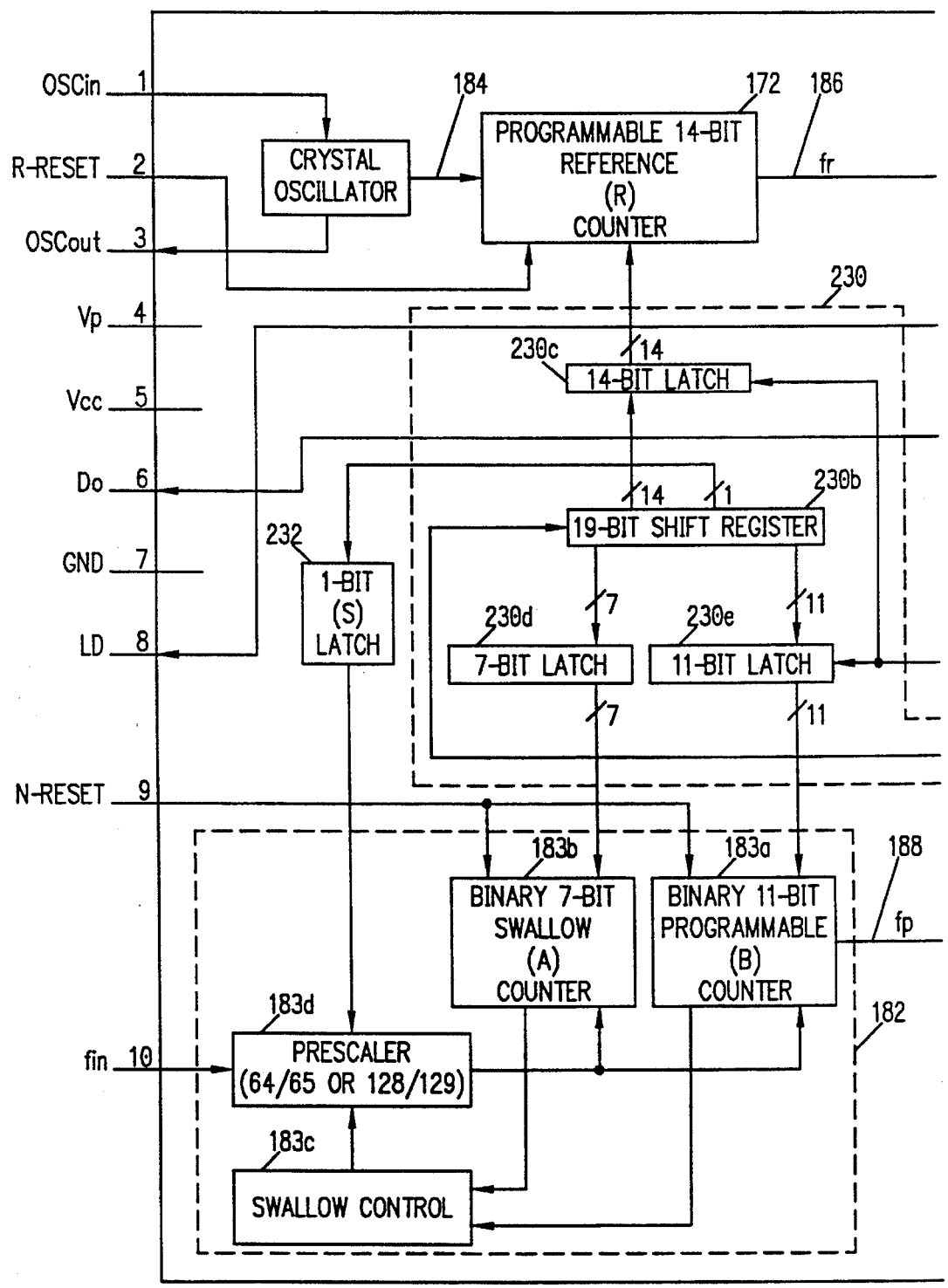
FIG. 6 is a simplified functional block diagram of an integrated circuit containing the frequency dividers and phase detector for a PLL in accordance with a preferred embodiment of the present invention.
Figure 6B:
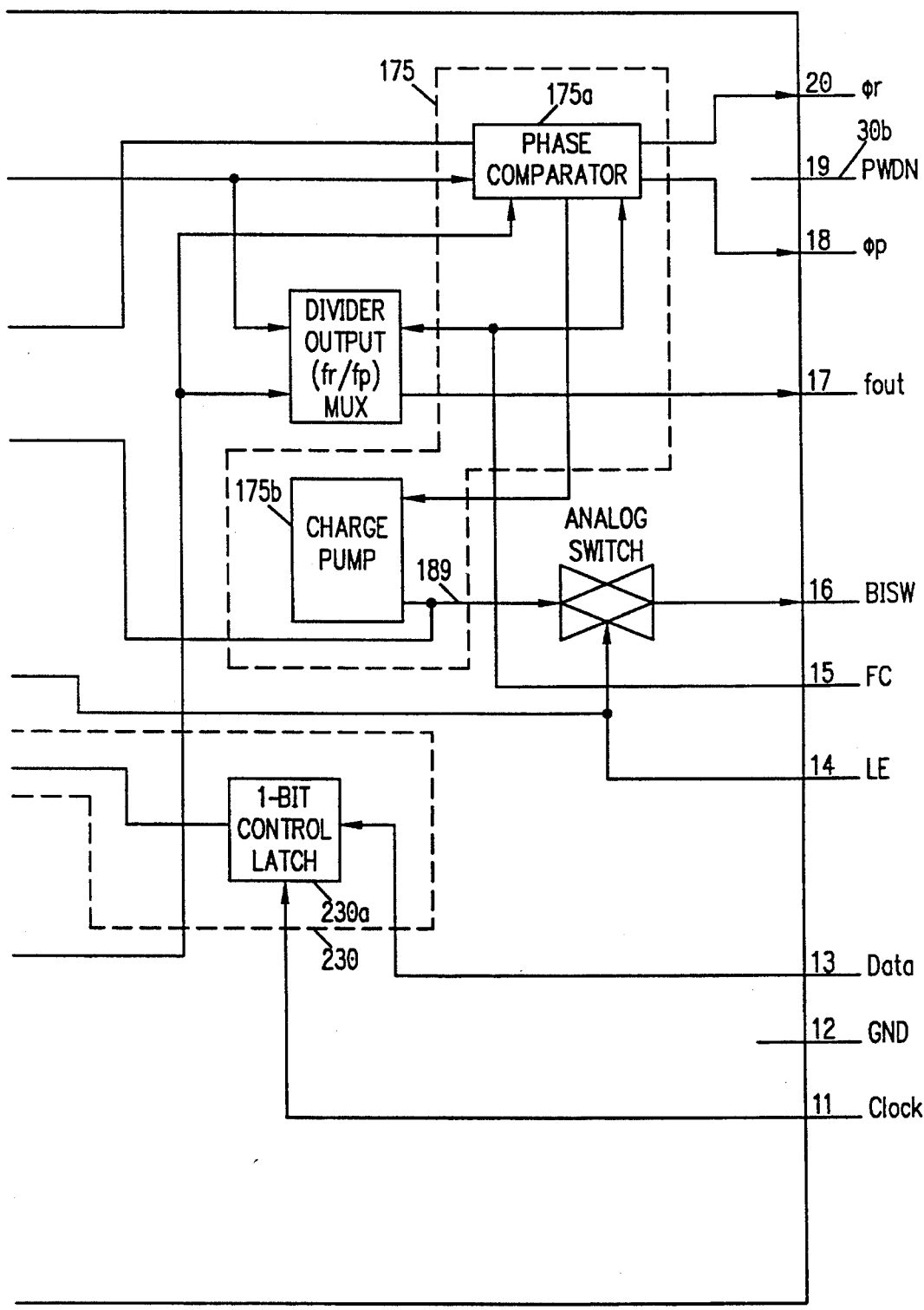

Referring to FIG. 6, that portion of the PLL 114 shown in FIG. 5 can be implemented in an integrated circuit form according to the block diagram as shown. The data register 230 (FIG. 5) includes a control latch 230a, a shift register 230b and three latches 230c, 230d, 230e for loading the divisors data into the reference divider 172 and/or feedback divider 182. The feedback divider 182 includes a programmable counter 183a, a swallow counter 183b, a swallow controller 183c and a prescaler 183d. The swallow counter 183b and swallow controller 183c control the selection of the prescaler divisor, e.g. by selecting 64 or 65 for a 64/65 prescaler, or 128 or 129 for a 128/129 prescaler. The programmable counter 183a divides the output of the frequency-prescaled signal from the prescaler. (The remaining elements operate substantially as discussed above.)

Figure 7:
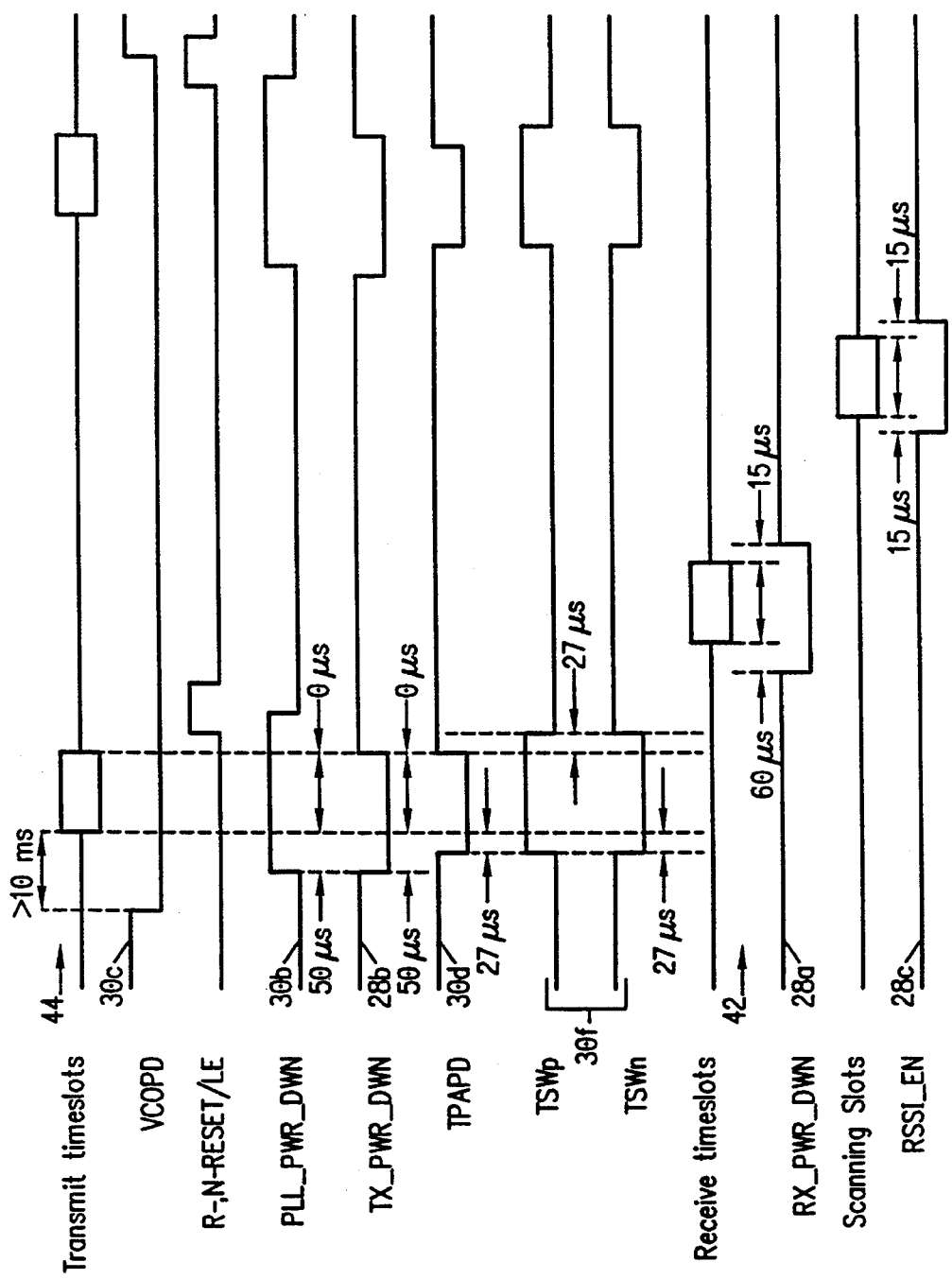
FIG. 7 illustrates exemplary signal timing relationships for the various data and control signals used in an RF transceiver system using a PLL in accordance with the present invention.

Referring to FIG. 7, in a preferred embodiment of the present invention, the above-discussed control signals 28a, 28b, 28c, 30b, 30c, 30d, 30f are preferably aligned in time, relative to the reception of the receive data time slots 42 and transmission of the transmit data time slots 44, as shown. The leading (e.g. rising per FIG. 7) edges of the R-reset and N-reset signals, which initiates the divider resets (or, alternatively, the load enable LE signal, which initiates the divider presets), would ideally be aligned with the trailing (e.g. falling per FIG. 7) edge of the PLL power down signal 30b (active high) and the trailing (e.g. rising per FIG. 7) edge of the transmit power down signal 28b (active high). (Accordingly, if desired, the reset or load enable signals (active high) can be the same as, or derived from, the PLL power down signal 30b, e.g. by tying the former signals' lines to that of the latter.) However, since resetting (or presetting) of the dividers does require a finite amount of time, the leading edges of the reset or load enable signals should precede, at least slightly, the trailing edge of the PLL power down signal 30b. Thus, the resetting (or presetting) of the dividers 172, 182 is done upon (or slightly before) the closing of the loop (e.g. when the PLL is powered up per FIG. 3 or the loop switch 176 is closed per FIG. 4).

As should be recognized from the foregoing, the presetting of either the reference 172 or feedback 182 divider, or both, allows the user to selectively predetermine the phase settling time of the PLL output signal 130. For example, if the phase detector is completely reset, i.e. by selectively resetting (presetting to zero) either or both the reference 172 and feedback 182 dividers, the PLL 114 can be "forced" to re-acquire phase-lock based upon an "assumption" of a very small (e.g. approximately zero) frequency error between the frequency-divided reference $f_R$ 186 and feedback $f_P$ 188 signals. This helps to prevent large jumps in output frequency upon reclosure of the loop when large differences in phases—but not frequency—of the frequency-divided reference $f_R$ 186 and feedback $f_P$ 188 signals exist. (Other ways of "resetting" the dividers can include stopping one counter at zero while allowing the other counter to reach zero count, or disabling operation of the loop until such time as both counters are at zero count.) Alternatively, one or both of the dividers 172, 182 can be preset to some value, either zero (as if reset) or nonzero, or one of the dividers 172/182 can be preset to some zero or nonzero value when the other divider 182/172 is in some known state. This will result in the PLL 114 beginning re-acquisition of phase-lock from some preselected phase error between the frequency-divided reference 186 and feedback 188 signals.

Moreover, if some form of "tuning hold" signal is maintained while the PLL 114 is open (as discussed above), not only can the phase-settling time be predetermined, it can be minimized. Application of a "tuning hold" signal ensures that the open-loop carrier frequency of the PLL output 130 is approximately equal to the closed-loop, phase-locked carrier frequency. Hence, any of the above-described phase detector presetting techniques will allow the resulting phase-settling time interval to be selectively minimized since the difference in frequency between the open-loop carrier and the final phase-locked, closed loop signal is small.

Various other modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such specific embodiments. It is intended that the following claims define the scope of the present invention, and that structures and methods within the scope of these claims and their equivalence be covered thereby.

What is claimed is:

1. A phase-lock loop (PLL) in which the loop is selectively opened and then re-closed to re-achieve phase-lock with a reference signal within a selectively predetermined phase-settling time interval, comprising:

frequency-tunable oscillator means for selectively receiving a PLL tuning signal and in accordance therewith providing a closed-loop oscillator signal, and for providing an open-loop oscillator signal which includes a plurality of open-loop carrier frequencies when said PLL tuning signal is not being received, wherein initially upon said receiving of said PLL tuning signal said closed-loop oscillator signal includes a plurality of phase-unlocked closed-loop carrier frequencies and phases, and after said phase-settling time interval includes a phase-locked closed-loop carrier frequency and phase;

signal comparator means, coupled to said frequency-tunable oscillator means, for receiving said closed-loop oscillator signal and a reference oscillator signal which includes a reference carrier frequency and phase, and for comparing said closed-loop oscillator signal with said reference oscillator signal and in accordance therewith providing to said frequency-tunable oscillator means a closed-loop tuning signal as said PLL tuning signal, and further for receiving a comparator initialization signal in accordance with which said phase-settling time interval can be selectively predetermined, wherein said signal comparator means comprises signal disabler means for receiving a loop command signal and in accordance therewith enabling and disabling said providing of said PLL tuning signal to said frequency-tunable oscillator means, and wherein said signal disabler means comprises carrier holder means for receiving said loop command signal and in accordance therewith providing during a hold time interval a tuning hold signal substantially equal to said PLL tuning signal as provided immediately prior to said receiving of said loop command signal, wherein said phase-locked closed-loop carrier phase of said closed-loop oscillator signal is phase-locked to said reference oscillator signal, and wherein during said hold time interval each one of said plurality of open-loop carrier frequencies is approximately equal to said phase-locked closed-loop carrier frequency.

2. A PLL as recited in claim 1, wherein said carrier holder means comprises an input signal port for receiving a power down signal in accordance with which said signal comparator means is turned off.

3. A PLL as recited in claim 1, wherein said carrier holder means comprises a switch.

4. A PLL as recited in claim 1, wherein said signal comparator means further comprises a phase comparator for comparing said phase-locked and phase-unlocked closed-loop carrier phases of said closed-loop oscillator signal with said reference carrier phase of said reference oscillator signal, and wherein said PLL tuning signal comprises a phase difference signal.

5. A PLL as recited in claim 4, wherein said signal comparator means still further comprises reference divider means, coupled to said phase comparator for receiving and frequency-dividing said reference oscillator signal in accordance with a reference divisor.

6. A PLL as recited in claim 5, wherein said comparator initialization signal comprises a reference divider preset signal for presetting said reference divisor.

7. A PLL as recited in claim 4, wherein said signal comparator means still further comprises feedback divider means, coupled to said phase comparator, for receiving and frequency-dividing said closed-loop oscillator signal in accordance with a feedback divisor.

8. A PLL as recited in claim 7, wherein said comparator initialization signal comprises a feedback divider preset signal for presetting said feedback divisor.

9. A phase-lock loop (PLL) in which the loop is selectively opened and then re-closed to re-achieve phase-lock with a reference signal within a selectively predetermined phase-settling time interval, comprising:

a frequency-tunable oscillator which selectively receives a PLL tuning signal and in accordance therewith provides a closed-loop oscillator signal, and which provides an open-loop oscillator signal including a plurality of open-loop carrier frequencies when said PLL tuning signal is not being received, wherein initially upon said receiving of said PLL tuning signal said closed-loop oscillator signal includes a plurality of phase-unlocked closed-loop carrier frequencies and phases, and after said phase-settling time interval includes a phase-locked closed-loop carrier frequency and phase;

a signal comparator, coupled to said frequency-tunable oscillator, which receives said closed-loop oscillator signal and a reference oscillator signal including a reference carrier frequency and phase, and which compares said closed-loop oscillator signal with said reference oscillator signal and in accordance therewith provides to said frequency-tunable oscillator a closed-loop tuning signal as said PLL tuning signal, and which further receives a comparator initialization signal in accordance with which said phase-settling time interval can be selectively predetermined, wherein said signal comparator comprises a signal disabler which receives a loop command signal and in accordance therewith enables and disables said providing of said PLL tuning signal to said frequency-tunable oscillator, and wherein said signal disabler comprises a carrier holder which receives said loop command signal and in accordance therewith provides during a hold time interval a tuning hold signal substantially equal to said PLL tuning signal as provided immediately prior to said receiving of said loop command signal, wherein said phase-locked closed-loop carrier phase of said closed-loop oscillator signal is phase-locked to said reference oscillator signal, and wherein during said hold time interval each one of said plurality of open-loop carrier frequencies is approximately equal to said phase-locked closed-loop carrier frequency.

10. A PLL as recited in claim 9, wherein said carrier holder comprises an input signal port which receives a power down signal in accordance with which said signal comparator is turned off.

11. A PLL as recited in claim 9, wherein said carrier holder comprises a switch.

12. A PLL as recited in claim 9, wherein said signal comparator further comprises a phase comparator which compares said phase-locked and phase-unlocked closed-loop carrier phases of said closed-loop oscillator signal with said reference carrier phase of said reference oscillator signal, and wherein said PLL tuning signal comprises a phase difference signal.

13. A PLL as recited in claim 12, wherein said signal comparator still further comprises a reference divider, coupled to said phase comparator, which receives and frequency-divides said reference oscillator signal in accordance with a reference divisor.

14. A PLL as recited in claim 13, wherein said comparator initialization signal comprises a reference divider preset signal which presets said reference divisor.

15. A PLL as recited in claim 12, wherein said signal comparator still further comprises a feedback divider, coupled to said phase comparator, which receives and frequency-divides said closed-loop oscillator signal in accordance with a feedback divisor.

16. A PLL as recited in claim 15, wherein said comparator initialization signal comprises a feedback divider preset signal which presets said feedback divisor.

17. A method of operating a phase-lock loop (PLL) in which the loop is selectively opened and then re-closed to re-achieve phase-lock with a reference signal within a selectively predetermined phase-settling time interval, comprising the steps of:

selectively receiving a PLL tuning signal and in accordance therewith generating a closed-loop oscillator signal, wherein initially upon said receiving of said PLL tuning signal said closed-loop oscillator signal includes a plurality of phase-unlocked closed-loop carrier frequencies and phases, and after said phase-settling time interval includes a phase-locked closed-loop carrier frequency and phase;

generating an open-loop oscillator signal which includes a plurality of open-loop carrier frequencies when said PLL tuning signal is not being received;

receiving a loop command signal and in accordance therewith enabling and disabling said receiving of said PLL tuning signal by receiving said loop command signal and in accordance therewith providing during a hold time interval a tuning hold signal substantially equal to said PLL tuning signal as provided immediately prior to said receiving of said loop command signal, wherein said phase-locked closed-loop carrier phase of said closed-loop oscillator signal is phase-locked to said reference oscillator signal, and wherein during said hold time interval each one of said plurality of open-loop carrier frequencies is approximately equal to said phase-locked closed-loop carrier frequency;

receiving a reference oscillator signal which includes a reference carrier frequency and phase;

comparing said closed-loop oscillator signal with said reference oscillator signal and in accordance therewith generating a closed-loop tuning signal as said PLL tuning signal; and receiving an initialization signal and in accordance therewith preselecting said phase-settling time interval.

18. A PLL operation method as recited in claim 17, wherein said step of receiving said loop command signal and in accordance therewith providing during a hold time interval a tuning hold signal substantially equal to said PLL tuning signal as provided immediately prior to said receiving of said loop command signal comprises receiving a power down signal and in accordance therewith omitting said step of comparing said closed-loop oscillator signal with said reference oscillator signal and in accordance therewith generating a closed-loop tuning signal as said PLL tuning signal.

19. A PLL operation method as recited in claim 17, wherein said step of receiving said loop command signal and in accordance therewith providing during a hold time interval a tuning hold signal substantially equal to said PLL tuning signal as provided immediately prior to said receiving of said loop command signal comprises receiving said loop command signal and in accordance therewith switching said PLL tuning signal.

20. A PLL operation method as recited in claim 17, wherein said step of comparing said closed-loop oscillator signal with said reference oscillator signal and in accordance therewith generating a closed-loop tuning signal as said PLL tuning signal comprises comparing said phase-locked and phase-unlocked closed-loop carrier phases of said closed-loop oscillator signal with said reference carrier phase of said reference oscillator signal and in accordance therewith generating a phase difference signal as said PLL tuning signal.

21. A PLL operation method as recited in claim 20, wherein said step of comparing said closed-loop oscillator signal with said reference oscillator signal and in accordance therewith generating a closed-loop tuning signal as said PLL tuning signal further comprises frequency-dividing said reference oscillator signal in accordance with a reference divisor.

22. A PLL operation method as recited in claim 21, wherein said step of receiving an initialization signal and in accordance therewith preselecting said phase-settling time interval comprises receiving a reference divider preset signal and in accordance therewith presetting said reference divisor.

23. A PLL operation method as recited in claim 20, wherein said step of comparing said closed-loop oscillator signal with said reference oscillator signal and in accordance therewith generating a closed-loop tuning signal as said PLL tuning signal further comprises frequency-dividing said closed-loop oscillator signal in accordance with a feedback divisor.

24. A PLL operation method as recited in claim 23, wherein said step of receiving an initialization signal and in accordance therewith preselecting said phase-settling time interval comprises receiving a feedback divider preset signal and in accordance therewith presetting said feedback divisor.

* * * * *